United States Patent [19]

Safabakhsh

[11] Patent Number: 5,169,196

[45] Date of Patent: Dec. 8, 1992

[54] NON-CONTACT PICK-UP HEAD

[76] Inventor: Ali R. Safabakhsh, 317 Bridgade Ct., Wayne, Pa. 19087

[21] Appl. No.: 716,275

[22] Filed: Jun. 17, 1991

[51] Int. Cl.$^5$ .............................................. B25J 15/06
[52] U.S. Cl. ...................................... 294/64.3; 271/97
[58] Field of Search ................... 294/64.3; 271/195, 97

[56] References Cited

FOREIGN PATENT DOCUMENTS 1227216 10/1966 Fed. Rep. of Germany ..... 294/64.3
211236 9/1987 Japan ................................. 294/64.3
2-92195 12/1990 Japan ................................. 294/64.3

OTHER PUBLICATIONS

IBM Technical Disclosure Bulletin; Oct., 1979; vol. 22 No. 5.

IBM Technical Disclosure Bulletin; Jan., 1980; vol. 22 No. 8a.

Primary Examiner—Margaret A. Focarino
Assistant Examiner—Joseph D. Pape

[57] ABSTRACT

A pick-up tool or pick-up head is provided for picking up semiconductor objects. The active face of the pick-up tool is provided with an outer plenum which extends around the peripheral edges of the object to be picked up and further includes an inner plenum formed in the center of the pick-up tool over the object to be picked up. A partial vacuum is applied to the inner plenum and compressed air is supplied to the outer plenum which flows over a support ridge separating the inner plenum from the outer plenum. The air flowing over the ridge generates a thin air film supporting layer so that the object being picked up by the pick-up tool is supported on the air film and levitated separate and apart from the pick-up tool.

11 Claims, 4 Drawing Sheets

NON-CONTACT PICK-UP HEAD

BACKGROUND OF THE INVENTION

1. Field of the Invention

The present invention relates to pick-up heads that are capable of picking up an object such as a semiconductor chip or die without engaging the active surface of the die. More particularly, the present invention relates to pick-up heads that exert a very large pick-up force that extends over a greater distance than prior art vacuum pick-up tools or pick-up heads.

2. Description of the Prior Art

Heretofore, tools for picking up semiconductor chips could be made from simple tubes attached to a vacuum source. Since such pick-up tools engaged the front active surface of the semiconductor device, the semiconductor device could be damaged during die bonding. One solution to the problem was to make the tip of the pick-up tool from a hard plastic which would not scratch the active surface of the die or chip. Another solution was to grasp the semiconductor device only at its edges and not by its active surface. Such pick-up tools are shown and described in U.S. Pat. Nos. 3,458,102, 3,686,229 and 4,990,051.

Such prior art pick-up tools have been used effectively for producing and packaging integrated circuit devices. However, new large scale integrated devices are being produced which exceed 1½" on a side and are often made on substrates no thicker than 12 mils. When the thickness of the die needs to be made very thin and the area of the die made very large, it is very difficult to pick up and bond the die with a prior art type die collet without creating a condition that overly stresses the die at the edges or at the active surface.

Accordingly, it would be extremely desirable to provide a contactless pick-up head for picking up fragile die without making contact with the active surface or the edges of the die and have the head or pick-up tool still be able to exert sufficient bonding force on the die to effect die bonding.

SUMMARY OF THE INVENTION

It is a primary object of the present invention to provide a die pick-up tool for picking up a die without the tool physically contacting the active surface of the die.

It is another principal object of the present invention to provide a novel die pick-up tool for a die bonder which is capable of picking up a preselected die from an adhesive layer prior to a die bonding operation.

It is another primary object of the present invention to provide a novel die pick-up tool for picking up a die without touching the top or side surfaces of the die.

It is another object of the present invention to provide a die pick-up tool for die bonding a die to a substrate and for exerting pressure on the top active surface of the die without contacting the die.

It is another object of the present invention to provide a novel die pick-up tool which centers the die in the pick-up tool without contacting the die.

It is another object of the present invention to provide a novel die pick-up tool which is operable with an air supply source and does not require a vacuum source.

It is another object of the present invention to provide a novel pick-up tool that will pick a die from a die pocket or carrier at a greater distance than was heretofore possible using prior art pick-up tools.

According to these and other objects of the present invention a novel die pick-up tool has an upper body portion adapted to be connected to a holder in a die bonder. A lower end portion of the pick-up tool is provided with a plurality of positioning fingers located at the peripheral edges of the pick-up tool for positioning the die within the positioning fingers. The lower end portion has an active pick-up surface which includes a raised ridge portion that defines a boundary between an outer plenum and an inner plenum on the working face of the tool. A supply of air under pressure is coupled to the lower end portion of the die pick-up tool for supplying air to the outer plenum. Part of the air supplied to the outer plenum is diverted radially outward under the die to be picked up and creates an air cushion under the die. Part of the air supplied to the outer plenum is diverted radially inward over the raised ridge and into the inner plenum forming a supporting air film on said ridges and providing a partial vacuum pick-up force over said inner plenum.

DESCRIPTION OF THE PREFERRED EMBODIMENTS

Figure 1:
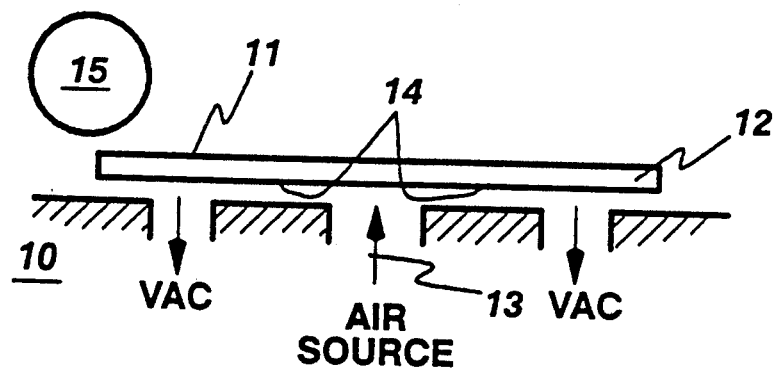
FIG. 1 is a diagrammatic elevation drawing in section of a prior art vacuum table of the type used to grind the reverse side of a semiconductor wafer.

Refer now to FIG. 1 showing a diagrammatic drawing of a prior art vacuum table 10 used to grind the reverse side or surface 11 of a wafer 12. In the process of making semiconductor wafers, it is sometimes necessary to process the wafer 12 at a thickness that is greater than the desired final thickness. Thus, after processing the wafer 12 it is placed face down on a vacuum table 10 which is provided with an air source 13 that generates a supporting air film between the table 10 and the active surface 14 of the wafer 12 prior to sawing the wafer into discrete die elements. A grinding wheel 15 is shown diagrammatically juxtaposed the reverse surface 11 of the type that is used to grind the surface and generate a thinner wafer 12 and remove any deviation of the rear surface from its two parallel plane with the front active surface.

Figure 2:
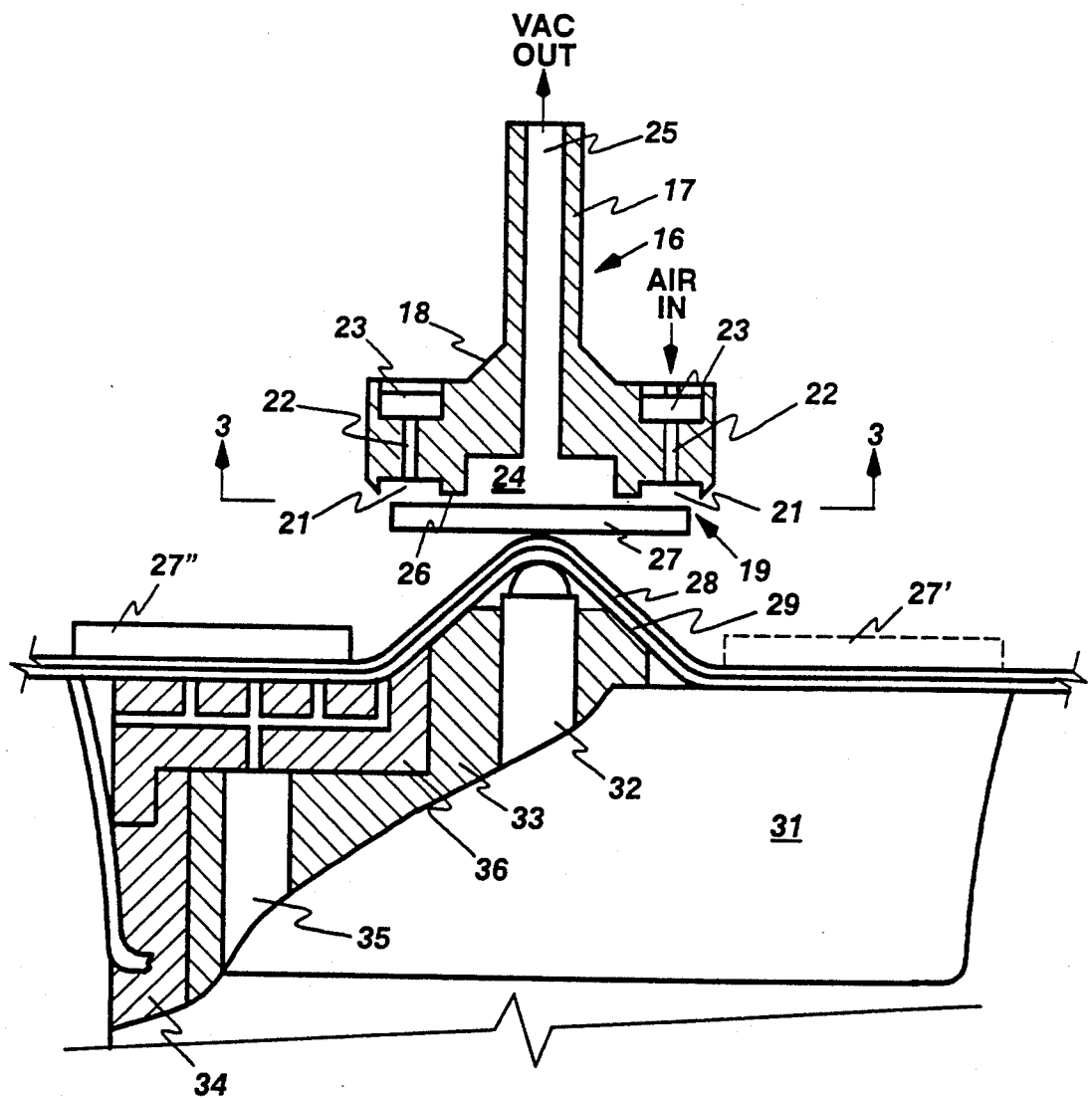
FIG. 2 is an enlarged elevation end partial section of the present invention pick-up tool removing a die from an adhesive carrier.

Refer now to FIG. 2 showing an enlarged elevation in partial section of a present invention pick-up tool 16. Tool 16 comprises an upper body portion 17 which is adapted to be inserted into a bond head of a die bonder. Tool 16 further comprises a lower portion 18 having an active face 19. Face 19 has an outer plenum portion 21 which is connected by a plurality of passage ways 22 to a manifold 23 which in turn is connected to a source of pressurized air. It will be understood that the manifold 23 extends around the perimeter of the lower body 18 and that the outer plenum 21 extends around the outer perimeter of the active face 19. The active face 19 is further provided with an inner plenum 24 which is connected by a conduit or passageway 25 to a vacuum source (not shown). In the present embodiment of the invention shown in FIG. 2, air passing into plenum 21 passes over ridges 26 or a continuous ridge 26 and enters plenum 24 where it is exhausted out passageway 25.

The pressurized air in outer plenum 21 also passes out into the atmosphere and forms an air cushion support for the peripheral outer edges of the die 27. Further, an air film is created over the ridge 26 as the air passes from the outer plenum 21 into the inner plenum 24, thus, providing a thin air film for preventing the die 27 from contacting the active face of the pick-up tool 19. The inner plenum 24 is held at a partial vacuum, thus creating a substantial pick-up and holding force for the die 27.

In the preferred embodiment shown, die 27 is being picked up from an adhesive layer on a stretchable plastic carrier 29 on which a sawn wafer has been placed. The detailed description of the die eject chuck 31 is shown and described in my issued U.S. Pat. No. 4,990,051 and does not require a detailed description herein. The die eject pin 32 is shown pushing up die 27 from the adhesive 28 on carrier 29, after having been isolated by die eject collar 33 when the outer housing 34 was moved vertically downward relative to the die eject collar 33 by virtue of vacuum means 35 and outer chuck face 36 which pulls the plastic carrier 29 down over the die eject collar 33. In the preferred embodiment of the invention shown in FIG. 2, the die eject chuck 31 moves relative to pick-up tool 16 and the previously picked up die 27' is shown in phantom lines and the next die to be picked up 27'' is shown in its position prior to pick-up.

Figure 3:
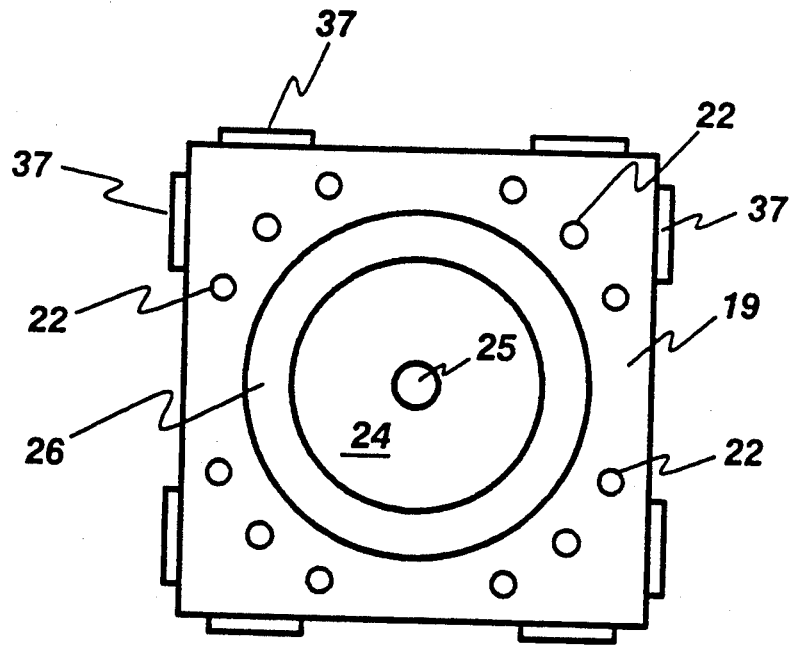
FIG. 3 is a bottom view of the active face of the die pick-up tool of FIG. 2 taken at lines 3—3 of FIG. 2.

Refer now to FIG. 3 showing a bottom view of the active face 19 of the pick-up tool 16. A plurality of fingers 37 are shown at the peripheral edge of the active face 19. The passageways 22 are drilled in the lower body 18 and communicate with the manifold 23 (shown in FIG. 2).

It will be understood that air entering the outer plenum 21 through passageways 22 is directed radially outward in all directions therefrom. Some of the air impinges on the fingers 37 thus forming a layer of air between the edges of the die 27 and the fingers 37. The larger amount of the air entering plenum 2 through passageways 22 passes over ridge 26 and enters the inner plenum 24 before passing into the vacuum passageway 25, thus, creating a thin supporting film on the entire annular ridge ring 26. It will be understood that the die 27 may be held accurately juxtaposed the ridge 26 centered inside of the fingers 37 without contacting the active face 19 or the ridge 26 of the pick-up tool 16.

Figure 4:
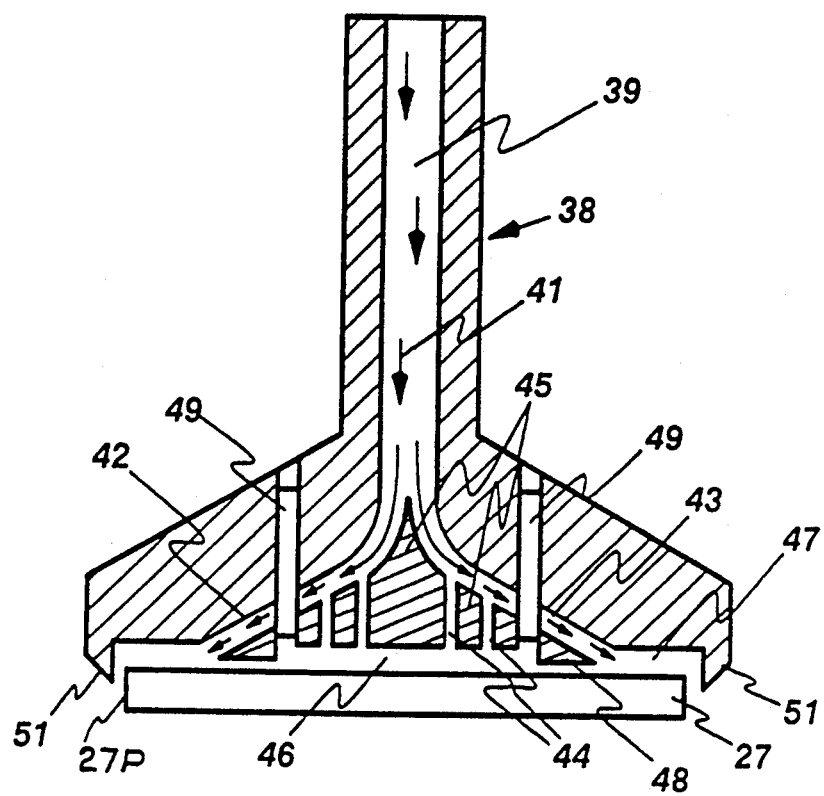
FIG. 4 is an enlarged elevation in section of a modified die pick-up tool which generates the vacuum pick-up force from a stream of pressurized air.

Refer now to FIG. 4 showing an enlarged elevation in section of a modified die pick-up tool which generates its vacuum pick-up force from a stream of pressurized air. Bonding tool 38 is shown having a passageway 39 for directing a stream of air 41 radially outward as shown at passageways 42 and 43. As the air 41 passes over the apertures 44 in recirculation plate 45, it generates a vacuum effect in the inner plenum 46. The air stream 41 which is directed radially outward enters the outer plenum 47 at a reduced pressure and passes over the ridge 48 into the inner plenum 46 and generates a supporting air film over the ridge 48. Thus, the air entering outer plenum 47 passes into inner plenum 46 and is recirculated through the vacuum apertures 44 which connect the inner plenum 46 to the passageways 42 and 43.

It will be understood that the recirculating plate or cone 45 has an included angle and proper shaped entrance which divert the air stream 41 in a manner which permits continuous laminar flow. If the cone angle of the recirculation plate 45 is too great, the air stream becomes turbulent as it passes over the apertures 44 thus destroying a large portion of the effective vacuum. It has been found that the included angle of the cone 45 may be adjusted between 90 and 120 degrees and still maintain a proper laminar flow. Exceeding these desirable limits diminishes the vacuum in the apertures 44.

The recirculating cone 45 was manufactured separate and apart from the lower body portion of the pick-up tool 38 and the two parts were connected by connection pins 49 creating a coaxial passageway 42, 43 between the two conical parts when assembled.

Figure 5:
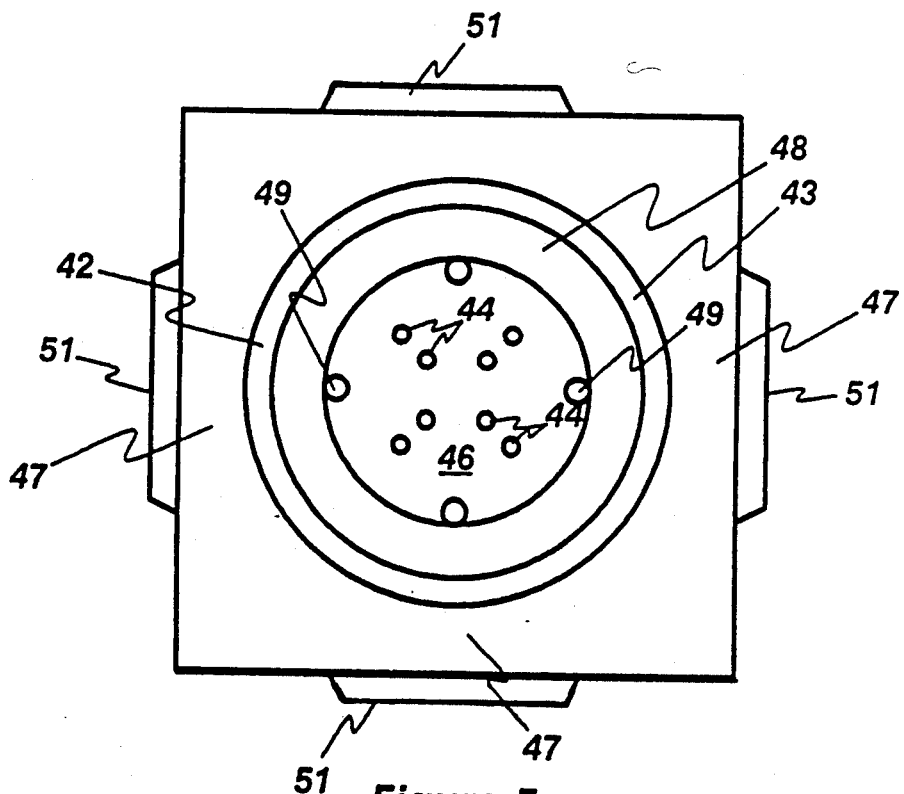
FIG. 5 is a bottom of the active face of the die pick-up tool of FIG. 4.

Refer now to FIG. 5 showing a bottom view of the active face of the die pick-up tool of FIG. 4. The fingers 51 are shown as single fingers on each side and positioned closest to the plenum 47. Thus, the air coming out of the annular passageway 42, 43 attempts to move radially in all directions and impinges on the fingers 51 so as to center the die 27 away from the fingers 51. The air in plenum 47 also passes over the ridge 48, shown as an annular ring, and enters the inner plenum 46 before passing through the vacuum apertures 44 in the conical recirculating plate. Connection pins 49 are shown positioned 90 degrees from each other at the extreme outer portion of the inner plenum 46. Having explained that the pick-up tool shown in FIGS. 4 and 5 is capable of generating a vacuum in plenum 46 using only a source of pressurized air in passageway 39, it will be appreciated that the pick-up force in the inner plenum 46 cannot be readily adjusted without redesigning the openings of the passageways 42 and 43 and/or changing the pressure of the air stream 41.

In the preferred mode of operation air pressure in passageway 39 may be adjusted over a wide range of values. The major portion of the air which enters plenum 47 flows radially outward and generates a low Bernoulli-effect as it passes between the parallel surfaces of the die 27 and tool face of the plenum 47 and exits past the permitercil vertical edges 27P. A small portion of the air in plenum 47 flows radially inward over the face of raised annular ring or ridge 48 and generates an even lower Bernoulli-effect attraction. The major holding force on the chip or die 27 is generated by an aspiration effect which generates a high vacuum in inner plenum 46 that is self-regulating over a wide range of supply air pressures. As the supply air pressure is increased, the positive pressure and the depth of the supporting air cushion increases in plenum 47. Also, the vacuum in inner plenum 46 increases, even though the flow of air over ridge 48 increases. Thus, the holding force and the separation distance and the depth of the bonding air cushion (bonding force cushion) all increase with air pressure over a desirable range of air supply pressures.

Figure 6:
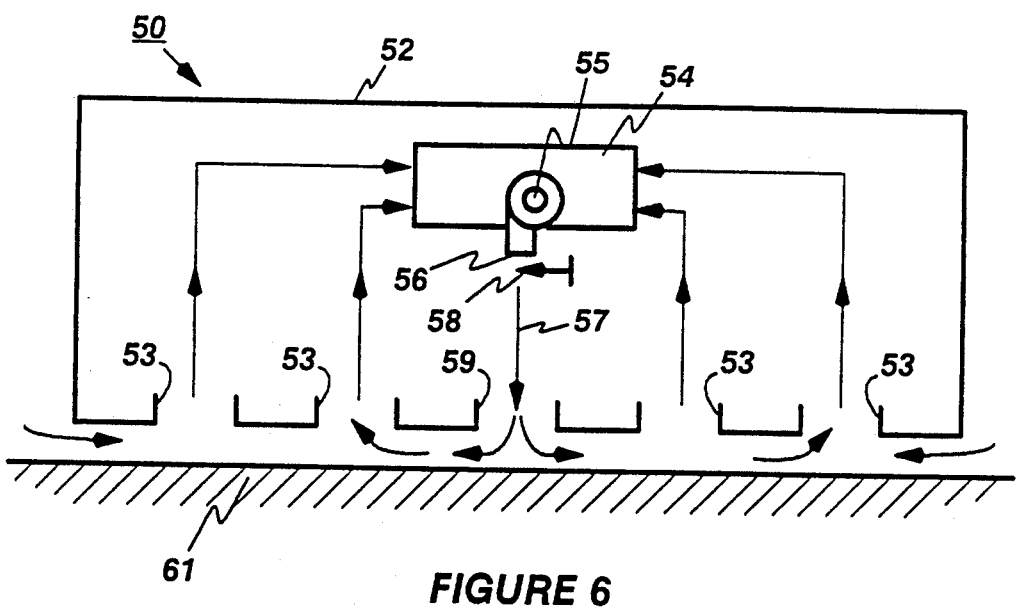
FIG. 6 is a diagrammatic elevation and schematic drawing of a modified pick-up head capable of picking up objects from a surface and partially supporting the pick-up head on the surface.

Refer now to FIG. 6 showing a schematic drawing of a modified pick-up head 50 capable of picking small objects from a surface and partially supporting the pick-up head on the surface. A housing 52 is diagrammatically shown including a plurality of vacuum ports 53. The vacuum ports 53 are connected to a vacuum box or chamber 54 in which a vacuum pump 55 is mounted.

The outlet 56 from the vacuum pump 55 is shown connected to a pressurized air source 57 which connects to the pressure outlet port 59. It will be appreciated that the surface 61 may be a resilient surface such as a rug or a hard surface such as a floor. In either event, the pressurized air source 57 would create an air film under the ports and generate a sweeping action in any surface such as a rug. Thus, dust particles embedded in the rug or hard surface 61 will be swept into the vacuum ports 53 and returned to the vacuum box 54. The amount of support or levitation can be adjusted by adjustment means 58 which diverts part of the pressurized air source 57 through port 59. Having explained the variation of the pick-up head with reference to FIG. 6, it will be appreciated that the vacuum pump 55 and vacuum box 54 may be located remote from the actual pick-up head 50. Further, it will be recognized that pick-up head 50 may be employed to pick-up fragile objects such as semiconductor wafers. Thus, the pick-up head shown in FIG. 6 may be used in transfer equipment where fragile wafers may be picked up with the non-contact pick-up head and placed during the process of manufacturer or wafers.

Having explained three preferred embodiments of the present invention, it will be appreciated that the die pick-up tool shown in FIGS. 2 through 5 are greatly enlarged and exaggerated drawings of actual pick-up tools which may be employed on actual die bonding machines such as model 6100 and 6300 made by Kulicke and Soffa Industries Inc. of Willow Grove, Pa.

What is claimed is:

1. Pick-up tool for picking up a semiconductor die and bonding it to a substrate, comprising:
   an upper body portion adapted to be connected to a bonding head of a semiconductor die bonder,
   a lower end portion having a working face adapted to pick-up and a semiconductor die during a bonding operation,
   said lower end portion having a plurality of position fingers located at the outer vertical edges of said pick-up tool for positioning said die within said positioning fingers,
   said lower end portion further having a raised ridge portion which defines a boundary between an outer plenum and an inner plenum on the working face of said pick-up tool,
   air supply means coupled to said lower end portion of said pick-up tool for supplying a stream of air under pressure to said outer plenum,
   part of said air supply to said outer plenum being diverted radially outward past the outer vertical edges of said die creating a supporting air cushion in said outer plenum which extends from said ridge to said outer edges of said die,
   means for producing a partial vacuum in said inner plenum, and
   part of said air supplied to said outer plenum being diverted radially inward over said raised ridge and into said inner plenum forming a supporting air film on said ridge and for maintaining said partial vacuum as a pick-up force in said inner plenum.

2. The pick-up tool as set forth in claim 1 wherein said inner plenum is cylindrical in shape.

3. The pick-up tool as set forth in claim 1 wherein said raised ridge comprises an annular ring.

4. A method of picking up semiconductor chips to avoid contacting the active surfaces thereon, comprising the steps of:

centering the working face of a pick-up tool having an inner plenum portion and outer plenum portion separated by a raised ridge portion juxtaposed over a semiconductor chip to be picked up,
applying a singular surface of fluid under pressure to the outer plenum portions of the pick-up tool positioned over the outer edge of said semiconductor chip to provide a positive pressure cushion layer of air which separates said chip from said pick-up tool,
directing a portion of said fluid under pressure in said outer plenum over said ridge portion into said inner plenum to provide a protective fluid layer on said raised ridge portion,
recirculating a portion of said fluid in said inner plenum back to said source of fluid in a manner which generates a partial vacuum, and
applying said partial vacuum to said inner plenum positioned over the center portion of said semiconductor chip which remains separated from said pick-up took, whereby possible damage to the active surfaces of said semi-conductor chip is avoided.

5. The method a set forth in claim 4 which further includes the step of applying said fluid under pressure to the outer plenum portions of said semiconductor chip which provides centering of said semiconductor chip in said pick-up tool by the step of diverting air along the vertical edges of said semiconductor chip.

6. The method as set forth in claim 4 which further includes supplying said partial vacuum through apertures in the center portion of said pick-pp tool.

7. Pick-up tool for picking up a semiconductor die to be bonded to a substrate, comprising:
   an upper body portion adapted to be connected to a bonding head of a semiconductor die bonder,
   a lower end portion having a working face adapted to pick-up and hold a semiconductor die during a bonding operation,
   said lower end portion having a plurality of position fingers located at the outer edges of said pick-up tool for positioning said die within said positioning fingers,
   said lower end portion further having a raised ridge portion which defines a boundary between an outer plenum and an inner plenum on the working face of said pick-up tool,
   air supply means coupled to said lower end portion of said pick-up tool for supplying a stream of air under pressure to said outer plenum,
   part of said air supply to said outer plenum being diverted radially outward past the outer edges of said die creating a supporting air cushion thereunder,
   aspiration means for producing a partial vacuum in said inner plenum comprising a conical shaped plate mounted in a conical recess in said working face of said pick-up tool in the path of said stream of air, and
   part of said air supplied to said outer plenum being diverted radially inward over said raised ridge and into said inner plenum forming a supporting air film on said ridge while maintaining a partial vacuum in said inner plenum for generating a die pick-up force.

8. The method as set forth in claim 4 which further includes the step of adjusting the pressure of the fluid in said outer plenum to increase or decrease the depth of said positive pressure cushion layer.

9. The method as set forth in claim 8 wherein the step of adjusting the pressure of the fluid comprises increasing said pressure to effect an increase in the depth of said cushion and an increase in said partial vacuum in said inner plenum.

10. The method as set forth in claim 4 which further includes the step of:
maintaining said semiconductor chip in the center of said pick-up tool by directing a portion of said fluid under pressure against positioning finger at the outer vertical edges of said semiconductor chip to form an air cushion therebetween.

11. The pick-up tool as set forth in claim 7 wherein said conical shape plate comprises a recirculation plate mounted in said conical recess and is adapted to divert the stream of air from said air supply means to an annular outlet connected to said outer plenum and is provided with apertures for pulling a vacuum on said inner plenum by aspiration effect.

* * * * *